Aug. 30, 1960 E. R. WYMA 2,951,184

PRINTED WIRING ASSEMBLY

Filed Dec. 24, 1956 4 Sheets-Sheet 1

Aug. 30, 1960 E. R. WYMA 2,951,184

PRINTED WIRING ASSEMBLY

Filed Dec. 24, 1956 4 Sheets-Sheet 2

INVENTOR
EDWIN R. WYMA
BY John E. Dougherty Jr
ATTORNEY

Aug. 30, 1960 E. R. WYMA 2,951,184

PRINTED WIRING ASSEMBLY

Filed Dec. 24, 1956 4 Sheets-Sheet 3

Aug. 30, 1960 E. R. WYMA 2,951,184

PRINTED WIRING ASSEMBLY

Filed Dec. 24, 1956 4 Sheets-Sheet 4

2,951,184

PRINTED WIRING ASSEMBLY

Edwin R. Wyma, Poughkeepsie, N.Y., assignor to International Business Machines Corporation, New York, N.Y., a corporation of New York Filed Dec. 24, 1956, Ser. No. 630,102

12 Claims. (Cl. 317—101)

The present invention relates to printed wiring assemblies and in particular to printed wiring assemblies having conductors extending in each of three mutually perpendicular directions on two groups of intersecting printed wiring boards.

The applications of printed wiring and printed circuit techniques in commercial electric and electronic equipment have become numerous in recent years. Initially applications were, in the main, restricted to the printing of circuit patterns on one or both sides of single insulating boards which were connected by conventional type wiring. Some attempts have been made to package circuits in three dimensional assemblies of stacked printed circuit boards molded together and interconnected by either printed circuit or post type connections extending through holes in or along the edge of the assembly. However, packages of this type, though having some advantages, do not lend themselves to accessibility for servicing and repair and are not sufficiently flexible to permit all of the interconnections, required by large scale electronic devices to be completed by printed circuitry. This is particularly true in the complex computing and data handling equipment such as is now being produced, and, though machines having component printed circuit cards have been built, it has been the practice up to now to interconnect the various component cards using conventional back panel wiring techniques.

A prime object of the present invention is to provide a novel three dimensional printed wiring assembly.

A further object is to provide a three dimensional printed wiring assembly for supporting component printed circuit cards and providing circuit paths for interconnecting the component circuit cards.

These objects and other objects hereafter set forth are achieved, as is illustrated in the embodiments of the invention herein disclosed, by providing a printed wiring assembly which includes two groups of intersecting printed wiring boards. The printed wiring boards in the first said group extend at right angles to those in the second group and the boards are provided with slots for mutual engagement at the intersections.

The dimensions of the boards and slots are such that at each intersection the mutually engaged boards of the first and second said groups have portions of their faces at right angles to each other in abutting or adjoining relationship. Circuit patterns conforming to the requirements of the particular machine are printed on the boards in each group before assembly and, where interconnections between the circuits on a board in one group and a board in the other group are required to be made, the circuit patterns are printed so that when assembled the conductors to be connected are in abutting relationship at the intersection of the boards. In this manner a connection may be made between a circuit printed on any one board and a circuit printed on any other board in the assembly. After the boards are assembled, the unit is immersed in a solder bath thereby connecting all the printed conductors in abutting relationship at the intersections. The functional circuit components which are interconnected and supplied with service, input and output lines by the assembly of intersecting boards are mounted on and electrically connected to the boards in one group to form a complete functional unit with all the back panel wiring necessary for its operation in the machine being fabricated.

Thus a further object of the present invention is to provide a novel method of employing printed wiring techniques in fabricating multidimensional functional and interconnecting circuitry for large and complex electronic equipment.

Another object is to provide a novel printed wiring assembly of the three dimensional type wherein the wiring is printed on first and second groups of intersecting mutually perpendicular boards assembled with connections between the boards being effected at the intersections thereof.

Another object becomes that of providing a three dimensional printed wiring assembly capable of being manufactured and serviced at relatively low cost.

A further object is to provide an assembly technique of this type wherein there is little or no restriction on the size or complexity of the circuitry to which it may be applied.

Still another object is to provide a novel and extremely flexible three dimensional wiring assembly wherein the boards making up the assembly are spaced from each other and all the printed wiring is exposed.

A further object is to provide a three dimensional back panel wiring assembly for supporting and electrically connecting functional electronic devices mounted on one side thereof wherein all connections are available and accessible for testing at the rear of the assembly.

Other objects of the invention will be pointed out in the following description and claims and illustrated in the accompanying drawings, which disclose, by way of example, the principle of the invention and the best mode, which has been contemplated, of applying the principle.

Figure 1:
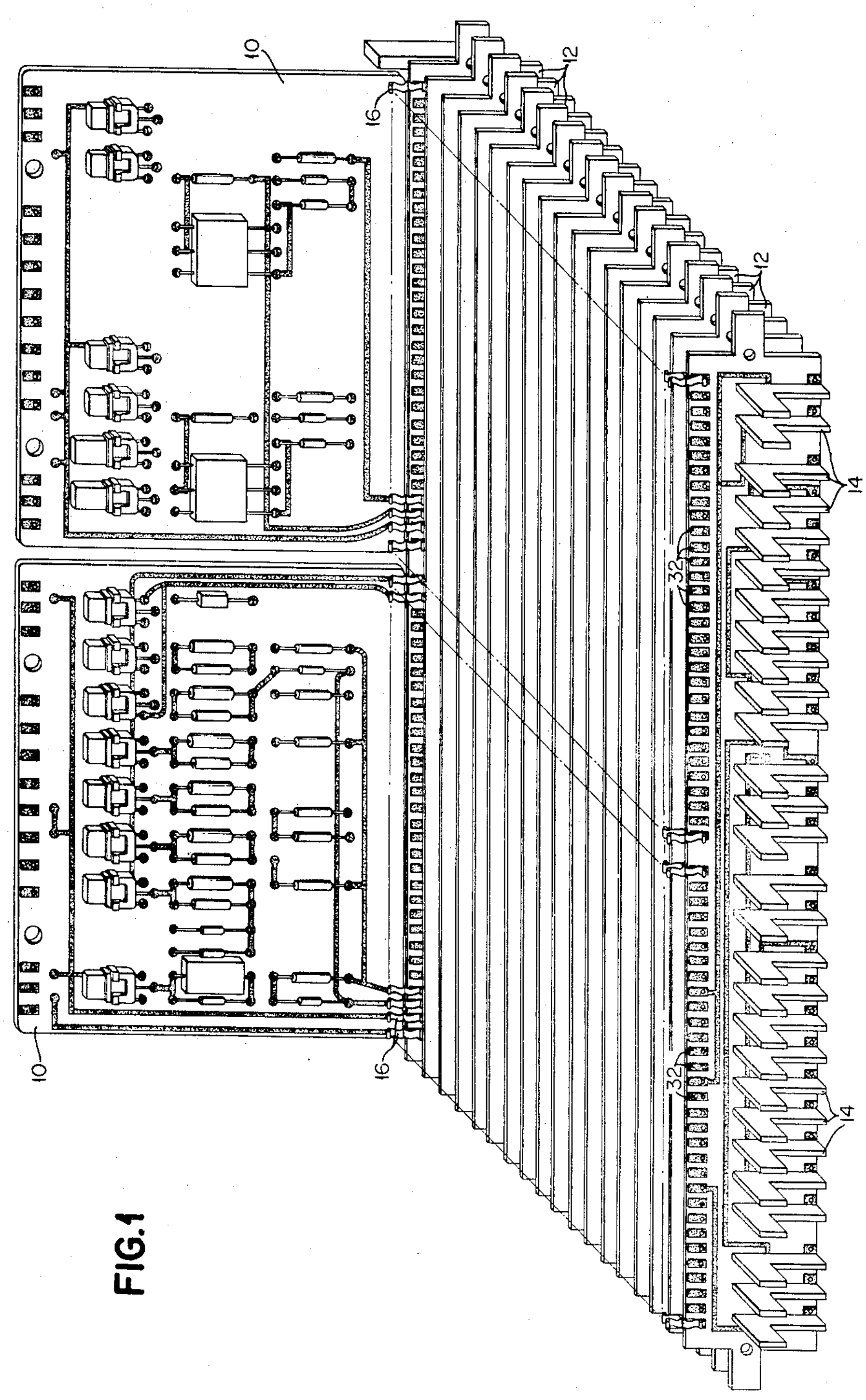
Fig. 1 is an isometric view of the novel three dimensional back wiring assembly.

Referring now to Fig. 1 there is shown a printed wiring back panel having mounted thereon, by way of illustration, two functional printed circuit boards. The printed circuit boards are designated 10 and each has mounted thereon a plurality of circuit elements such as transistors, resistors, capacitors and diodes, which are interconnected by printed wiring on the board to form particular functional circuits. Circuit boards of this nature are fully described in the copending application Serial Number 555,456, filed December 27, 1955, in behalf of W. Klippel et al. The back panel wiring which may be employed to carry service voltages to and effect interconnection between and among such functional boards comprises a plurality of intersecting printed wiring boards 12 and 14. For simplicity of explanation, the wiring boards 12 are hereafter referred to as vertical boards and the wiring boards 14 as horizontal boards. The functional circuit boards 10 are supported by and electrically connected to the vertical boards 12 through a plurality of metallic snap connectors 16 having opposing U-shaped arms which serve to grip lands or pads on the edge of each of the boards and which, if desired, may be soldered to the pads. Though only two functional printed circuit boards are shown mounted on the rear-most vertical wiring boards 12 in Fig. 1, it is, of course, evident that two such boards may be similarly mounted on each of the boards 12 in the nested back panel printed wiring assembly. The manner in which this assembly provides the necessary service voltages to the functional circuit boards and the desired circuit connections therebetween may be better understood from a consideration of the isometric drawing of Fig. 2.

Figure 2:
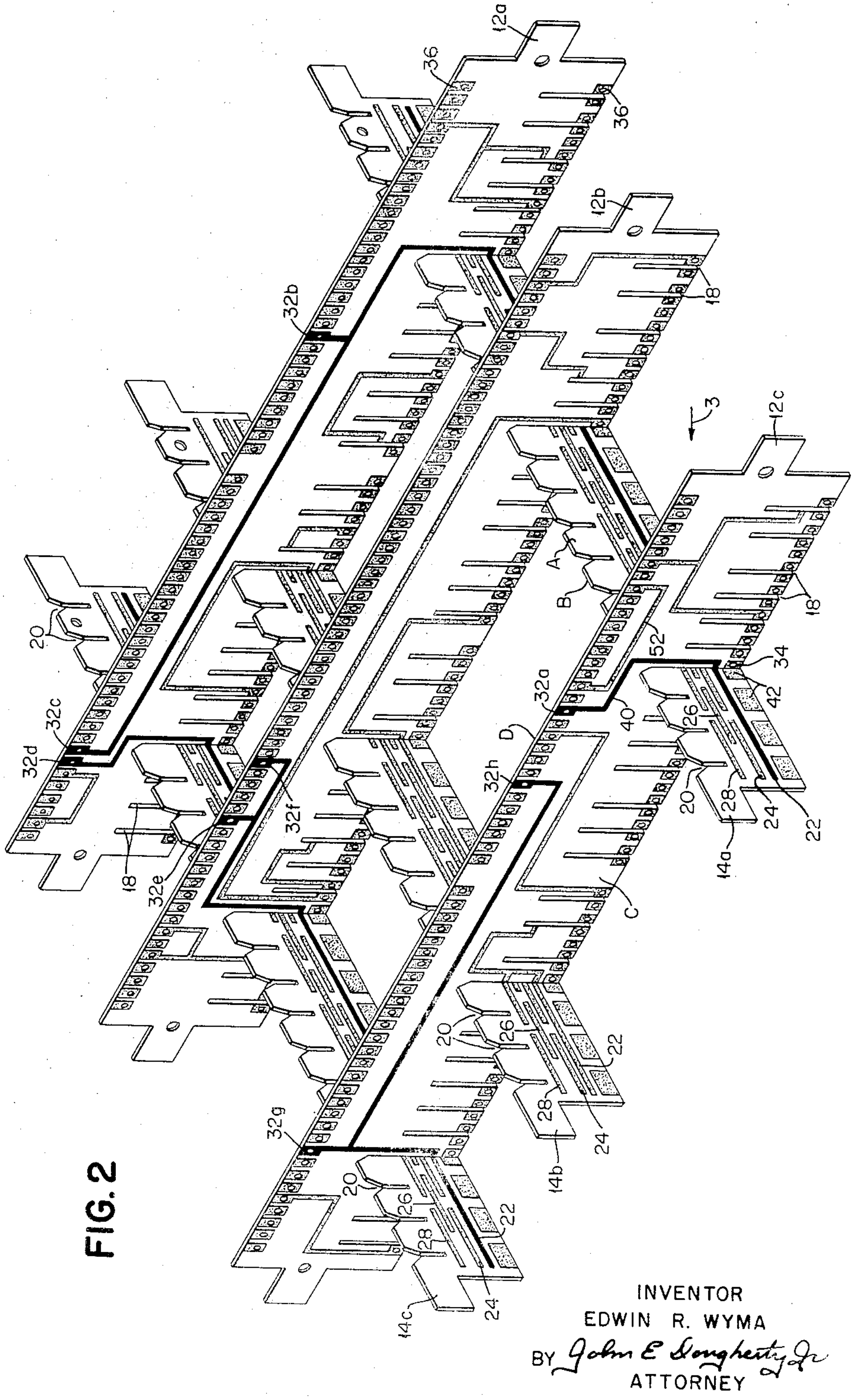
Fig. 2 is a further isometric view of two groups of intersecting printed wiring boards which illustrates the manner in which connections between various points in the assembly may be made.

In Fig. 2, there is shown three vertical boards 12 and three horizontal boards 14. The boards, for ease of explanation, are designated 12*a*, 12*b*, 12*c*, 14*a*, 14*b* and 14*c*. Each of the vertical boards 12 is provided with a plurality of slots 18 and each of the horizontal boards with a plurality of slots 20. Each of the boards is initially provided, employing any one of the several known printed wiring techniques, with a printed wiring pattern in a desired configuration. The term printed wiring techniques is here used in a broad sense and is meant to include any method of achieving conductive patterns on insulating boards. The boards are assembled by fitting the vertical boards 12 into the slots 20 in the horizontal boards 14 so that at the intersection of each vertical and horizontal board a slot 20 on the horizontal board 14 bears against either side of the intersecting vertical board and a slot 18 of the vertical board 12 bears against each side of the intersecting horizontal board 14. In Fig. 2, only three boards of each type are shown in order that the printed circuit patterns on each board as well as the manner of their interconnection might be more graphically illustrated.

Figure 3:
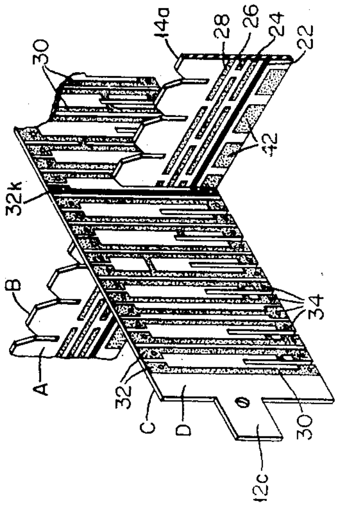

The printed wiring on each of the horizontal boards 14 in the embodiment illustrated in Fig. 2 is the same; each board 14 having a single continuous conductor 22 and three rows of conductive segments 24, 26 and 28 printed on the side A of the board which is shown. Though not shown in this figure, each board 14 is provided with a similar arrangement of conductors on its rear side B. It should be noted that the arrangement of conductors and segments on these boards may be varied in accordance with circuit requirements. The printed circuit pattern on the front side C on each vertical board 12 differs in accordance with the service voltage and interconnection requirements of the functional circuit boards 10 which are to be mounted thereon. The rear side D of each vertical board 12 is, as shown in Fig. 3, provided with a plurality of vertical circuit paths 30 which connect pads 32 and 34 on the upper and lower edges of the boards. Circuit paths extending between vertical paths 30 or from particular vertical paths to an adjoining slot 18 may be also provided at selected places on the rear sides of the boards to effect desired connections in a manner about to be explained.

Electrical connections between the conductive vertical and horizontal boards are made at the intersections where the slots 18 in the vertical boards 12 fit over and bear against a portion of both sides A and B of the horizontal boards 14. Where it is necessary that a connection be made between vertical and horizontal board conductors, the printed conductor on the board 12 is extended to the edge of the slot 18 which bears against the horizontal board 14 carrying the conductor to which the connection is to be made. The slots 18 and 20 register the intersecting boards so that the adjoining faces on which the conductors are printed are in proper alignment.

For example, if we consider that a particular service voltage is applied by external circuit sources to the conductor 22 on the front side A of horizontal board 14, the darkened conductors in Fig. 2 illustrate the manner in which this service voltage may be carried to a pad 32*a* on vertical board 12*c* and to pads 32*b* and 32*c* on vertical board 12*a*. It should be here noted that the pads 32 and 34 on either side C and D of the upper and lower edges, respectively, of vertical boards 12 are electrically connected by conductive paths printed in the openings 36. In order to achieve the above mentioned service voltage connections, it is necessary to provide, on the front side C of board 12*c*, a conductor 40 extending from pad 32*a* to the edge of the slot 18 which engages board 14*a* at the level of the conductor 22. After the boards are assembled the conductor 40 on board 12*c* is in close proximity with the conductor 22 on board 14*a* and permanent electrical connection at this point as well as at other intersections are made at one time by dip soldering the nested boards. It should be here noted that each of the horizontal boards 14 is provided along its lower edge with a plurality of pads 42 which are not employed for effecting electrical connections but which have a relatively large surface area in close proximity with the pads 34 and during the dip soldering operation relatively large solder deposits form fillets between the pads 42 and 34. These fillets, being all in the same plane and, as noted, connecting relatively large adjoining surfaces, serve to ensure sufficient mechanical strength and rigidity at each of the intersections regardless of whether or not electrical connections are made at each intersection.

The three dimensional aspect of the printed back panel wiring is illustrated by the conductors on boards 12 which connect pads 32*b* and 32*c* to conductor 22 on board 14*a* which conductor is, as explained above also connected to pad 32*a* on board 12*c*. In a similar manner any pad 32 on any one of the vertical boards 12 may be connected through appropriate printed wiring to any pad 32 on any one of the pads on the same or another vertical board 12. Though the printed wiring on the boards shown is kept at a minimum to render easier the understanding of the manner in which connections are made, a further illustration of this same type of interconnection is illustrated by the shaded wiring interconnecting pads 32*d*, 32*e* and 32*f*, and 32*g* and 32*h*, on vertical boards 12*a*, 12*b* and 12*c*, respectively.

A fuller understanding of the flexibility of the printed wiring arrangement may be had from a consideration of Fig. 3 which is a further isometric view of the intersection between boards 14*a* and 12*c* looking in the direction of the arrow 3 in Fig. 2. As shown, the upper and lower pads 32 and 34 on board 12*c* are connected by conductors 30 printed on the rear side of this board. These conductors serve to make available at the lower edge of the board electrical terminals common with each of the points at which connections are made through clips 16 to the functional circuit cards 10 (see Fig. 1). This feature is especially important when the back panel structure is mounted in a machine with the boards 14 in spaced parallel horizontal planes and the boards 12 in spaced vertical planes. The functional circuit boards are seated in clips 16 and extend away from the nested back panel structure in planes parallel to the planes of the vertical boards 12. The density of the functional boards and components, when a completed unit with back panel wiring is assembled, may make access to the pads 32 difficult. However, the conductors 30 make available all of the points in the different circuits at the rear of the back panel assembly thereby greatly facilitating testing and trouble shooting under machine operating conditions. Fig. 3 also illustrates the manner in which the conductors 30 may be utilized to complete connections from horizontal board conductors such as 22 to pads 32 on vertical boards. As shown in Fig. 2, there is a printed conductor 52 on the front face C of board 12*c* which extends across the point at which this board is nested with vertical board 12c thereby preventing circuits from being completed on this side of the board from certain of the pads 32 to conductors on board 14a. Connections may, however, be made on the reverse side of board 12c as indicated by the shaded conductors shown in Fig. 3 connecting conductor 22 with pad 32k.

Figure 4:
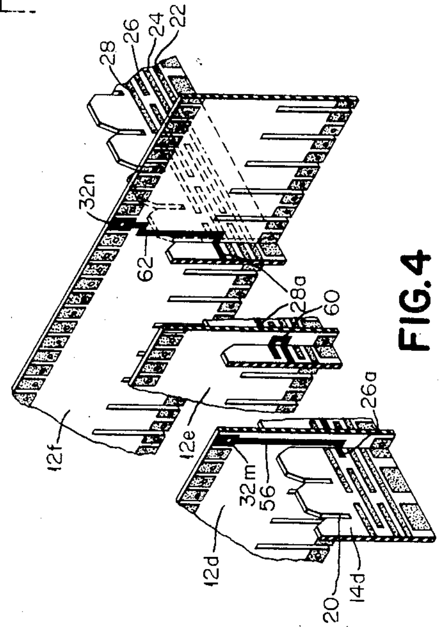
Figs. 3 and 4 are further partial isometric views of intersecting printed wiring boards illustrating different methods of achieving intercircuit connections.

Fig. 4 illustrates the manner in which the conductors 24, 26 and 28 on the boards 14 may be employed to complete circuits between pads 32 on the horizontal boards. In this figure there are shown three vertical boards 12d, 12e and 12f fitted into successive slots 20 in a horizontal board designated 14d. A pad 32m on board 12d is connected by a conductor 56 to segment 26a on board 14d. The segments 24, 26 and 28 are long enough to complete connections between circuits on two adjacent vertical boards but overlap at the intersections so that they may be connected by printed conductors on vertical boards intermediate the boards carrying the pads 32 between which a connection is to be made. Here the conductor 60 on board 12e effects connection of segment 26a with a segment 28a and the latter segment extends to the intersection of board 14d with vertical board 12f at which point the circuit connection is completed through a conductor 62 to pad 32n.

Service voltages and input and output connections from the nested back panel to external circuitry may be made to one of the vertical boards 12 merely by placing clips, of the type shown in the aforementioned copending application Serial Number 555,456, or any other suitable connecting devices on the pads 32 on any one or more of the horizontal boards. These clips have one end U-shaped to fit over and engage the pads 32 and are provided at their other ends with receptacles into which plug wires may be inserted.

Figure 6:
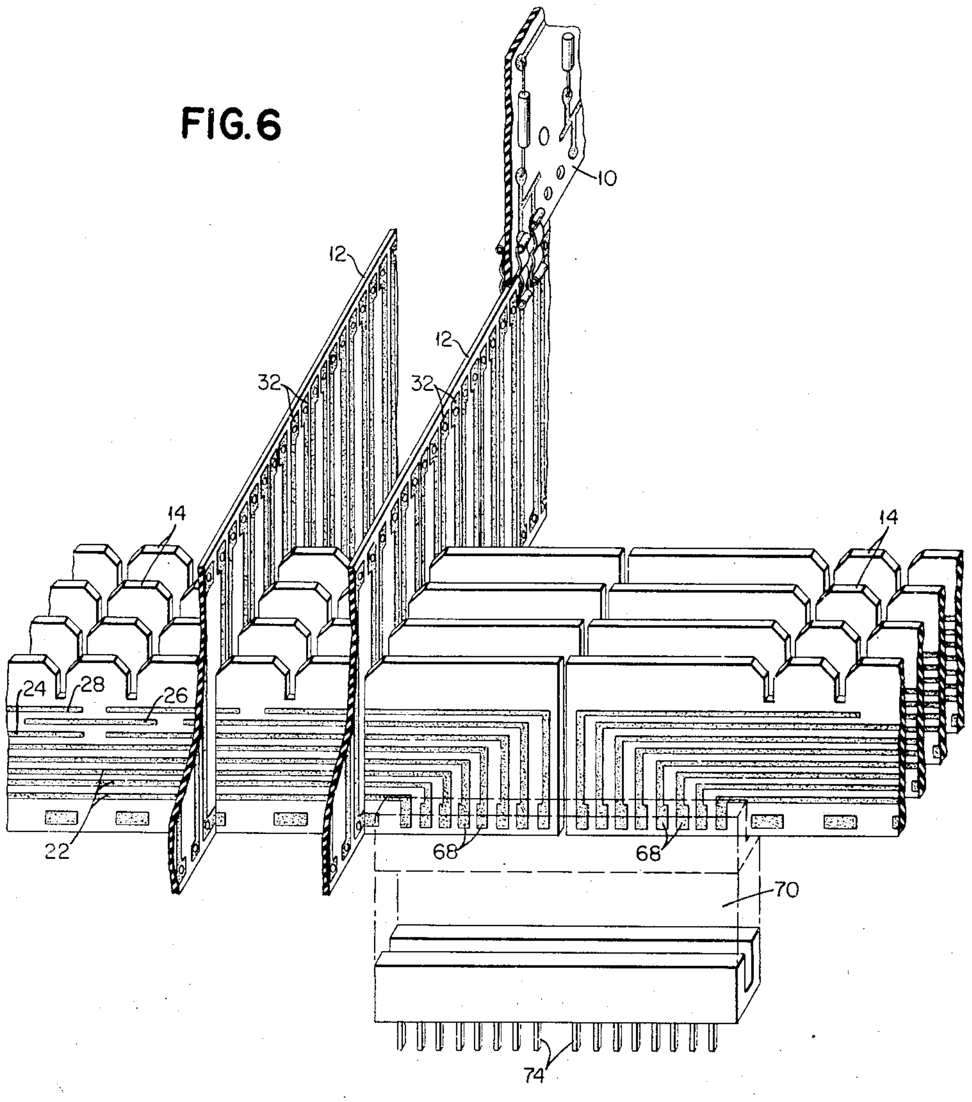
Fig. 6 is a view showing the manner in which two of the novel assemblies may be constructed and mounted for cooperation with the connector shown in Fig. 5.

Another method of achieving connections to external circuitry and also interconnections between different back panel assemblies is illustrated in Fig. 6. Each of the boards 14 shown in this figure is provided with an extension having a plurality of continuous conductors which are terminated in pads 68 along the lower edge of the boards. It should be noted that the boards 14 shown in Fig. 6 are provided with a larger number of conductors 22 thereby illustrating that the capacity of the back panel printed wire assemblies may be increased merely by increasing the size of the boards and the number of conductors printed thereon. The conductors 22 and the last of each group of conductor segments 24, 26 and 28 are as shown connected to the pads 68.

Two printed back wiring assemblies may be mounted in a machine with the extending edges of the horizontal boards 14 adjacent each other as shown in Fig. 6. Service voltage and external connections are made by a plug connector 70 which fits over the lower edges of the adjacent horizontal printed wiring boards.

Figure 5:
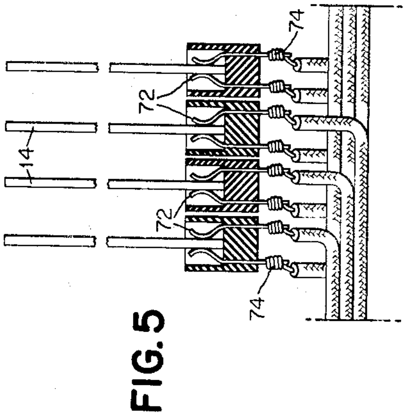
Fig. 5 is a side view of a connector which may be employed to connect external circuit wiring to two adjacently mounted three dimensional printed wiring assemblies.

Fig. 5 is an end view of one of the back panel assemblies of Fig. 6 illustrating the manner in which spring clip connectors 72 carried in the plug connector 70 bear against the pads 68 on horizontal boards 12. It should be noted that the pads 68 on the opposite sides of the boards 12 are not connected by plated holes and thus an individual external connection may be made to each pad 68 on each side of each board 14. The clip connectors 72 have extensions 74 which, as illustrated in Fig. 5, may be connected to cable wiring in the machine. The wires, as shown, are connected to the clips by a wire wrapping process since this process lends itself to automatic assembly techniques.

One advantage of the nested back panel assembly is that, once designed, its stray capacitance, which can by design be limited to a minimum, is established for each machine in which the structure is to be used. Further, since the nested arrangement of printed circuit boards is open it becomes much easier to cool the component devices mounted on the functional printed circuit boards.

A further feature of this open type of three dimensional unit lies in the fact that circuit changes may be made easily since individual boards may be removed from the assembly with the use of a soldering iron and a new board having a different printed wiring pattern inserted in place and soldered.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore, to be limited only as indicated by the scope of the following claims.

What is claimed is:

1. A printed wiring back panel assembly comprising a first plurality of longitudinally extending printed wiring boards arranged in parallel spaced relationship; a second plurality of transversely extending printed wiring boards arranged in parallel spaced relationship; each of said boards in said first plurality having a plurality of slots therein, each of said boards in said second plurality being fitted into a slot in each of said boards in said first plurality; a plurality of conductor segments extending on each of said transversely extending boards in spaced parallel relationship in a direction substantially perpendicular to said longitudinally extending boards, first and second conductor segments on at least one of said longitudinally extending boards extending to the slot therein in which a first one of said transversely extending boards is fitted, each of said first and second segments being aligned with and electrically connected to a different one of said conductor segments on said first transversely extending board, and conductor segments on others of said longitudinally extending boards extending from longitudinal edges thereof to different ones of said slots in alignment with conductors on said transverse boards.

2. A method of fabricating a three dimensional back panel wiring assembly comprising the steps of printing a plurality of longitudinally extending conductors on a first board; printing conductors in selected patterns on second, third and fourth slotted boards with one conductor on each extending to the slot in the board on which it is printed; fitting said first board into said slots in said second, third and fourth boards with said second, third and fourth boards extending substantially at right angles to said longitudinally extending conductors on said first board and with said conductors on each of said second, third and fourth boards which extend to said slots aligned with and adjoining predetermined ones of said longitudinally extending conductors on said first board; and dipping said boards in a solder bath.

3. In a printed back panel wiring assembly, first, second and third printed wiring boards each having first, second and third slots therein, said boards having conductive pads along an edge thereof and conductive paths extening on the faces thereof from said pads to different ones of said slots; said boards being arranged in parallel spaced relationship with said first slots aligned to form a first row of slots, said second slots aligned to form a second row of slots and said third slots aligned to form a third row of slots; fourth, fifth and sixth printed wiring boards fitted respectively into said first, second and third rows of slots, the dimensions of said slots relative to those of said fourth, fifth and sixth boards being such that the faces of each of said fourth, fifth and sixth boards are in abutting relationship with the faces of each of said first, second and third boards at the slots in said first, second and third boards, and a plurality of conductive paths on each of said fourth, fifth and sixth boards for effecting connections to said conductive paths on said first, second and third boards, said conductive paths on each of said fourth, fifth, and sixth boards extending in parallel spaced relationship in a direction normal to said first, second, and third boards and aligned with said conductive paths extending on the adjoining faces of said first, second, and third boards to the slots therein.

4. In a printed wiring back panel assembly, first, second and third printed wiring boards each having first and second slots therein, said boards being arranged in parallel spaced relationship with said first and second slots in each aligned to form first and second rows of slots extending substantially at right angles to the faces of said boards; fourth and fifth printed wiring boards arranged in intersecting relationship with said first, second and third boards and fitted respectively into said first and second rows of slots; the dimensions of said fourth and fifth boards and said slots being such that the faces of each of said fourth and fifth boards are in adjoining relationship with the faces of each of said first, second and third boards at the intersections at which said fourth and fifth boards are fitted into said slots in said first, second and third boards; a plurality of conductive segments on the faces of each of said third and fourth boards extending in a direction substantially at right angles to the faces of said first, second and third boards; and a plurality of conductive paths on said first, second and third boards extending to said slots therein at points adjacent selected ones of said adjoining conductive segments on the faces of said fourth and fifth boards.

5. In a printed wiring assembly, a first group of at least three printed wiring boards having faces extending in parallel spaced relationship in a first direction, a second group of printed wiring boards having faces extending in parallel spaced relationship in a second direction substantially perpendicular to said first direction, each of said boards in said second group intersecting each of said boards in said first group, said boards in said first group having a plurality of slots in which said boards in said second group are fitted at the intersections of said boards, said boards having portions of their faces in abutting relationship at said intersections, conductors on said boards in said first group extending on the faces thereof to selected intersections with said board in said second group at which the faces of said boards are in abutting relationship, and conductors on said boards in said second group extending on the faces thereof to said selected intersections and aligned with said conductors on the abutting faces of said boards in said first group at said intersections.

6. In a printed wiring assembly, a first group of at least three printed wiring boards having faces extending in parallel spaced relationship in a first direction, a second group of printed wiring boards having faces extending in parallel spaced relationship in a second direction substantially perpendicular to said first direction, each of said boards in said second group intersecting each of said boards in said first group, said boards in said first group having a plurality of slots in which said boards in said second group are fitted at the intersections of said boards, each of said boards in said second group having a plurality of slots in which said boards in said first group are fitted at said intersections, said boards having portions of their faces in abutting relationship at said intersections, a plurality of conductors on each of said boards in said second group extending on the faces thereof to selected intersections with said boards in said first group at which the faces of said boards are in abutting relationship, and conductors on said boards in said first group extending on the faces thereof to said selected intersections and aligned with predetermined conductors on the abutting faces of said boards in said second group at said intersections.

7. In a printed wiring assembly, a first group of printed wiring boards having faces extending in parallel spaced relationship in a first direction, a second group of printed wiring boards having faces extending in parallel spaced relationship in a direction substantially perpendicular to said first direction, said boards in said second group intersecting said boards in said first group, each of said boards in said first group having portions of its faces in abutting relationship with portions of the faces of each of said boards in said second group with which it intersects, a plurality of terminals on said boards in said first group, a plurality of printed circuit cards supported on said boards in said first group and electrically connected to said terminals thereon, and conductive paths on said boards in said first and second groups extending to the intersections between the boards at which portions of the faces of the intersecting boards are in abutting relationship and interconnecting terminals on different ones of said boards in said first group.

8. In a printed wiring back panel assembly; first, second, and third printed wiring boards extending longitudinally in parallel spaced relationship in a first direction; a fourth printed wiring board extending longitudinally in a second direction substantially normal to said first direction and intersecting said first, second, and third boards; said first, second, and third boards being provided with slots into which said fourth board is fitted at the points at which it intersects said first, second, and third boards; the dimensions of said fourth board and said slots being such that the longitudinally extending faces of said fourth board are in abutting relationship with the longitudinally extending faces of said first, second, and third boards at said slotted intersections; a plurality of printed wiring segments extending on longitudinal faces on said first, second, and third boards from terminals thereon to said slots therein; and a plurality of spaced parallel printed wiring segments extending in said second direction on a longitudinal face of said fourth board; there being a plurality of said segments on said fourth board in adjoining relationship with the longitudinal faces of said first, second, and third boards at each of said slotted intersections; each of said conductive segments on said first, second, and third boards extending to the slot therein being aligned with and electrically connected to one of said adjoining segments on said fourth board.

9. In a printed wiring back panel assembly; first, second, and third printed wiring boards extending longitudinally in parallel spaced relationship in a first direction; fourth and fifth printed wiring boards extending longitudinally in parallel spaced relationship in a second direction substantially normal to said first direction and each intersecting said first, second, and third boards; said first, second, and third boards being provided with slots into which said fourth and fifth boards are fitted at the points at which they intersect said first, second, and third boards; the dimensions of said boards and said slots being such that the longitudinally extending faces of said fourth and fifth boards are in abutting relationship with the longitudinally extending faces of said first, second, and third boards at said slotted intersections; a plurality of printed wiring segments extending on longitudinal faces on said first, second, and third boards from terminals thereon to said slots therein; and a plurality of spaced parallel printed wiring segments extending in said second direction on longitudinal faces of said fourth and fifth boards; there being a plurality of said segments on each of said fourth and fifth boards in adjoining relationship with the longitudinal faces of each of said first, second, and third boards at each of said slotted intersections; each of said conductive paths on said first, second, and third boards extending to one of the slots therein being aligned with and electrically connected to one of said adjoining segments on the adjoining one of said fourth and fifth boards.

10. In a printed wiring back panel assembly, a first group of printed wiring boards extending longitudinally in parallel spaced relationship in a first direction; a second group of printed wiring boards extending longitudinally in a second direction substantially normal to said first direction and intersecting each of said boards in said first group; each of said boards in said first group being provided with slots into which said boards in said second group are fitted at the points at which they intersect said boards in said first group; the dimensions of said boards and said slots being such that the longitudinally extending faces of said boards in said second group are in abutting relationship with the longitudinally extending faces of said boards in said first group at said slotted intersections; a plurality of printed wiring segments extending on longitudinal faces on said boards in said first group from terminals thereon to said slots therein; and a plurality of spaced parallel printed wiring segments extending in said second direction on each of the longitudinal faces of each of said boards in said second group; each of said wiring segments on the longitudinal faces of said first, second, and third boards extending to one of the slots therein being aligned with and electrically connected to one of said segments on the abutting longitudinal face of one of said boards in said second group.

11. In a printed wiring back panel assembly, a first group of printed wiring boards extending longitudinally in parallel spaced relationship in a first direction; a second group of printed wiring boards extending longitudinally in a second direction substantially normal to said first direction and intersecting each of said boards in said first group; each of said boards in said first group being provided with slots into which said boards in said second group are fitted at the points at which they intersect said boards in said first group; the dimensions of said boards and said slots being such that the longitudinally extending faces of said boards in said second group are in abutting relationship with the longitudinally extending faces of said boards in said first group at said slotted intersections; a plurality of terminals on the boards in each of said groups; and printed wiring conductors on said boards extending to the slotted intersections therebetween at which the faces of the boards are in abutting relationship for effecting electrical connections between said terminals.

12. In a printed wiring back panel assemby, a first group of printed wiring boards extending longitudinally in parallel spaced relationship in a first direction; a second group of printed wiring boards extending longitudinally in a second direction substantially normal to said first direction and intersecting each of said boards in said first group; each of said boards in said first group being provided with slots into which said boards in said second group are fitted at the points at which they intersect said boards in said first group; the dimensions of said boards and said slots being such that the longitudinally extending faces of said boards in said second group are in abutting relationship with the longitudinally extending faces of said boards in said first group at said slotted intersections; a plurality of terminals on the boards in each of said groups; and printed wiring conductors on each of said boards for effecting electrical connections between said terminals; the printed wiring conductors on at least some of the boards in one of said groups including a plurality of conductors on each longitudinal face of each said board extending in parallel spaced relationship in a direction normal to the direction in which the boards in the other group extend and connected to printed wiring on one or more of the boards in said other group at the slotted intersections therebetween at which the faces of the boards are in abutting relationship.

References Cited in the file of this patent

UNITED STATES PATENTS

| | | |
|---|---|---|
| 2,636,067 | Kraft | Apr. 21, 1953 |
| 2,701,346 | Powell | Feb. 1, 1955 |
| 2,799,837 | Powell | July 16, 1957 |